United States Patent
Oyamada et al.

(10) Patent No.: US 11,612,966 B2
(45) Date of Patent: *Mar. 28, 2023

(54) AG ALLOY BONDING WIRE FOR SEMICONDUCTOR DEVICE

(71) Applicants: NIPPON STEEL CHEMICAL & MATERIAL CO., LTD., Tokyo (JP); NIPPON MICROMETAL CORPORATION, Saitama (JP)

(72) Inventors: Tetsuya Oyamada, Tokyo (JP); Tomohiro Uno, Tokyo (JP); Daizo Oda, Saitama (JP); Motoki Eto, Saitama (JP); Takumi Ohkabe, Saitama (JP)

(73) Assignees: NIPPON STEEL CHEMICAL & MATERIAL CO., LTD., Tokyo (JP); NIPPON MICROMETAL CORPORATION, Saitama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/628,842

(22) PCT Filed: Nov. 12, 2020

(86) PCT No.: PCT/JP2020/042175
§ 371 (c)(1),
(2) Date: Jan. 20, 2022

(87) PCT Pub. No.: WO2021/100583
PCT Pub. Date: May 27, 2021

(65) Prior Publication Data
US 2022/0266396 A1 Aug. 25, 2022

(30) Foreign Application Priority Data

Nov. 22, 2019 (JP) .............................. JP2019-211498

(51) Int. Cl.
*B23K 35/30* (2006.01)
*C22C 5/06* (2006.01)
*H01L 23/00* (2006.01)

(52) U.S. Cl.
CPC ............ *B23K 35/3006* (2013.01); *C22C 5/06* (2013.01); *H01L 24/45* (2013.01); *H01L 2224/4517* (2013.01); *H01L 2224/45105* (2013.01); *H01L 2224/45109* (2013.01); *H01L 2224/45117* (2013.01); *H01L 2224/45138* (2013.01); *H01L 2224/45139* (2013.01); *H01L 2224/45147* (2013.01); *H01L 2224/45163* (2013.01); *H01L 2224/45164* (2013.01); *H01L 2224/45169* (2013.01)

(58) Field of Classification Search
None
See application file for complete search history.

(56) References Cited

U.S. PATENT DOCUMENTS

| | | | |
|---|---|---|---|
| 10,381,320 B2* | 8/2019 | Oyamada | ................ H01L 24/43 |
| 2009/0072399 A1* | 3/2009 | Terashima | .............. H01L 24/43 |
| | | | 257/E23.024 |
| 2012/0263624 A1 | 10/2012 | Chiba et al. | |
| 2014/0302317 A1 | 10/2014 | Antoku et al. | |
| 2017/0365576 A1 | 12/2017 | Oyamada et al. | |
| 2018/0374816 A1 | 12/2018 | Oda et al. | |

FOREIGN PATENT DOCUMENTS

| | | |
|---|---|---|
| CN | 104218012 A | 12/2014 |
| JP | H11-288962 A | 10/1999 |
| JP | 2016-115875 A | 6/2016 |
| JP | 2017-212457 A | 11/2017 |
| TW | 2014-32716 A | 8/2014 |
| TW | 2014-34052 A | 9/2014 |
| TW | 2014-40188 A | 10/2014 |
| WO | 02/23618 A1 | 3/2002 |
| WO | 2012/108082 A1 | 8/2012 |
| WO | 2015/115241 A1 | 8/2015 |

OTHER PUBLICATIONS

International Search Report issued in corresponding International Application No. PCT/JP2020/042175, dated Feb. 2, 2021 w/English Translation.
Office Action issued in corresponding Taiwan Application No. 109140234, dated Oct. 12, 2021.
Full Machine English Translation of Taiwanese Patent Application Publication No. 2014-34052 (previously cited).
Full Machine English Translation of Taiwanese Patent Application Publication No. 2014-32716 (previously cited).
Full Machine English Translation of Taiwanese Patent Application Publication No. 2014-40188 (previously cited).

* cited by examiner

*Primary Examiner* — Elizabeth Collister
(74) *Attorney, Agent, or Firm* — McDermott Will & Emery LLP

(57) ABSTRACT

An object of the present invention is to provide an Ag alloy bonding wire for a semiconductor device capable of extending the high-temperature life of a wire, reducing chip damage during ball bonding, and improving characteristics such as ball bonding strength in applications of on-vehicle memory devices. The Ag alloy bonding wire for a semiconductor device according to the present invention contains one or more of In and Ga for a total of 110 at ppm or more and less than 500 at ppm, and one or more of Pd and Pt for a total of 150 at ppm or more and less than 12,000 at ppm, and a balance being made up of Ag and unavoidable impurities.

8 Claims, No Drawings

AG ALLOY BONDING WIRE FOR SEMICONDUCTOR DEVICE

CROSS REFERENCE TO RELATED APPLICATIONS

This application is the U.S. National Phase under 35 U.S.C. § 371 of International Application No. PCT/JP2020/042175, filed on Nov. 12, 2020, which claims the benefit of Japanese Application No. 2019-211498, filed on Nov. 22, 2019, the entire contents of each are hereby incorporated by reference.

TECHNICAL FIELD

The present invention relates to an Ag alloy bonding wire for a semiconductor device used for connecting an electrode on a semiconductor element and a circuit wiring board such as an external lead.

BACKGROUND ART

Currently, as a bonding wire for a semiconductor device for bonding an electrode on a semiconductor element and an external lead, a thin wire having a wire diameter of approximately 15 to 50 μm is mainly used. A method of bonding a bonding wire is generally a thermosonic bonding process, and a general-purpose bonding device, a capillary jig for connecting a bonding wire by passing the bonding wire therethrough and so on are used. A bonding process of the bonding wire is as follows. First, a wire tip is heated and melted by heat input by arc heating to form a ball, and then the ball portion is bonded (hereinafter, referred to as ball bonding) onto an electrode of a semiconductor element heated in a temperature range of 150° C. or more and less than 300° C. Next, after the loop is formed, the wire portion is bonded (hereinafter, referred to as wedge bonding) to an electrode on the side of the external lead to complete the process. Electrodes in which an alloy film mainly composed of Al are formed on a Si substrate are often used for the electrodes on the semiconductor element to which the bonding wire is bonded and Ag-plated electrodes are often used for the electrodes on the side of the external lead.

Electronic components (hereinafter, referred to as a semiconductor device) using a semiconductor are used in a wide range of products from consumer applications such as smartphones and personal computers to on-vehicle applications such as electronic control components for automobiles and car navigation systems. The use of on-vehicle semiconductor devices is expected to increase in the future with the development of automated driving technology and the like.

An on-vehicle memory device is one of the on-vehicle semiconductor devices whose usage is expected to increase in the future. In the development of the on-vehicle memory device, an extension of the life of the device for withstanding use mainly in severe environments and an increase in the storage capacity have been promoted. Also in the development of the bonding wire, there is a demand for technological development to meet these requirements.

The bonding wire is required to satisfy performance such as ball formability, ball bondability, wedge bondability, and loop formability. In addition, it is necessary to impart required performance depending on the applications of the bonding wire.

In the on-vehicle memory device, improvement of a connection member including a sealing resin and a bonding wire constituting the memory device has been advanced in order to extend the life. As a method for accelerated evaluation of the life of the semiconductor device, a high temperature storage test, a high temperature high humidity test, a thermal cycle test, and the like are generally performed. When on-vehicle applications are assumed, in particular, the life in the high temperature storage test (hereinafter, referred to as high-temperature life) is required to be a predetermined period or more. For consumer applications, a life of approximately 500 hours is often required in an environment of 130 to 150° C., whereas for on-vehicle applications, a high-temperature life of 220° C. and 600 hours or more is required. In the high temperature storage test, deterioration of the ball bond area often becomes a problem. Therefore, the bonding wire is required to solve such problems and improve the high-temperature life.

In the on-vehicle memory device, reduction in thickness and multilayering of a memory chip have been promoted in order to increase the capacity. In a memory device including memory chips stacked in multiple stages, a thickness per memory chip is reduced, and the number of stacked memory chips is increased, thereby achieving a high capacity. The thickness of the memory chip currently used is mainly 30 to 50 μm, and is assumed to be reduced to 20 μm or less in the future. The bonding wire is required to stably have good bonding strength even when ball bonding is performed on an electrode on such a very thin memory chip.

As a bonding wire that comprehensively satisfies these required performances, a wire using Au (hereinafter, referred to as an Au wire) is considered to be promising. However, since Au is expensive, a substitute material for an inexpensive material is desired. As a bonding wire using an inexpensive material, for example, a wire using Cu or a wire using Ag (hereinafter, referred to as an Ag wire) is disclosed.

PTL 1 discloses an example of a bonding wire including a core material and a coating layer (outer peripheral portion), in which Cu is used for the core material and Pd is used for the coating layer. In the case of using this technique, since Cu and Pd are harder than Au, the memory chip may be damaged when ball bonding is performed, and the performance required for the on-vehicle memory device cannot be satisfied.

Ag has a low electric resistance and has a softness comparable to that of Au, and thus is considered to be suitable as a bonding wire material for a memory device. However, when Ag is used as a material of the bonding wire, there is a problem that it is difficult to extend the high-temperature life. As a technique for extending the high-temperature life, a technique of adding an alloy element to a bonding wire mainly composed of Ag is disclosed.

PTL 2 discloses a bonding wire containing one or more of Pt, Pd, Cu, Ru, Os, Rh, and Ir for a total of 0.1 to 10 wt. %, where Pt is contained 10 wt. % or less, Pd is contained 10 wt. % or less, Cu is contained 5 wt. % or less, Ru is contained 1 wt. % or less, Os is contained 1 wt. % or less, Rh is contained 1 wt. % or less, Ir is contained 1 wt. % or less, and the balance being made up of Ag and unavoidable impurities. The technique discloses that an increase in electric resistance of a circuit including a ball bond area, a wire bond area, a wire, and a lead can be suppressed in a high temperature storage test at 200° C.

CITATION LIST

Patent Literatures

PTL 1: International Patent Publication No. WO 02/23618
PTL 2: JP 11-288962 A

SUMMARY OF THE INVENTION

Technical Problem

Bonding wires used in on-vehicle memory devices are required to satisfy basic characteristics such as electrical conductivity, ball formability, wedge bondability, and loop formability, as well as to achieve extension of the high-temperature life, reduction in chip damage when ball bonding is performed on an electrode on a memory chip, and good ball bonding strength.

On-vehicle memory devices are required to have a high-temperature life of 600 hours or more in a high temperature storage test at 220° C. When a Ag wire using pure Ag (Ag purity: 99.99 wt. % or more) as a raw material was used, the required performance was not satisfied. This is because the ball is separated from the Al alloy electrode at the ball bond area, and the electrical connection is lost. As a result of analyzing the bonding interface of the ball bond area with a scanning electron microscope in order to clarify the location where separation occurred, an Ag—Al-based intermetallic compound was formed at the bonding interface of the ball bond area. The Ag—Al-based intermetallic compound is $Ag_3Al$ ($\mu$ phase) and $Ag_2Al$ ($\zeta$ phase), and separation occurred at the interface between the ball and $Ag_3Al$.

When ball bonding is performed, Ag and Al are diffused at a bonding interface between the Ag ball and the Al alloy electrode, and $Ag_2Al$ is mainly formed. When the high temperature storage test is performed, diffusion of Ag and Al proceeds at an initial stage, and $Ag_2Al$ grows. Further, when the high temperature storage test is continued, the entire Al alloy electrode is eventually consumed for the growth of the Ag—Al-based intermetallic compound. Thereafter, diffusion of Al from the Al alloy electrode to the Ag—Al-based intermetallic compound does not occur, and diffusion from Ag to the Ag—Al-based intermetallic compound mainly occurs. Then, the phase change from $Ag_2Al$ to $Ag_3Al$ proceeds, and $Ag_3Al$ grows. As the temperature of the high temperature storage test increases, the growth rate of the Ag—Al-based intermetallic compound increases, and the time required until all the Al alloy electrode is consumed decreases. Since the diffusion rate is high under severe high temperature conditions such as 220° C., $Ag_3Al$ presumably grows at an early stage, resulting in separation in a relatively short time.

In the case of using the technique disclosed in PTL 2, although an improvement in the high-temperature life was observed in the high temperature storage test at 220° C., the ball was separated from the electrode at the ball bond area before a lapse of 600 hours, and performance required for an on-vehicle memory device was not sufficiently satisfied.

The on-vehicle memory device is required to have good bonding strength at a ball bond area while reducing chip damage when ball bonding is performed on an electrode on a memory chip. Usually, since an Al oxide film exists on the surface of the Al alloy electrode, the Al oxide film inhibits diffusion of Ag and Al, and sufficient bonding strength may not be obtained. Therefore, in order to obtain good bonding strength in ball bonding, it is necessary to break the Al oxide film existing on the surface of the Al alloy electrode during ball bonding to diffuse Ag and Al.

When the ball is too soft, it is necessary to set the output of ultrasound and the load at the time of performing ball bonding to be high in order to break the Al oxide film on the surface of the Al alloy electrode. Then, a strong force is applied to the chip, and the chip may be damaged. On the other hand, when the ball is too hard, the ball is not sufficiently deformed by the ultrasound and load applied during ball bonding, and the chip may be damaged.

In order to solve the problem of chip damage, it is effective to perform bonding by setting the output and load of ultrasound during ball bonding to be low. However, when the output of the ultrasound and load are set to be low, the Al oxide film on the surface of the Al alloy electrode is not sufficiently broken, making it difficult to obtain good bonding strength in the ball bond area. From the above, the wire used in the on-vehicle memory device is required to achieve both good bonding strength in the ball bond area and reduction in chip damage.

In the on-vehicle memory device, high-density packaging is advanced along with high-functionality. Along with high-density packaging, high straightness of the loop when the loop is formed over a long span is required. Hereinafter, a loop formed with a long span is referred to as a long span loop. In high-density packaging, the interval between the loops becomes narrow, and even if the loops slightly fall, the loops come into contact with each other, causing a short-circuit. In bonding of the bonding wire, it is common to form a loop with a short span and a long span loop using the same wire. In particular, when the long span loop is formed, the loop easily falls down. Therefore, even when the long span loop is formed, the bonding wire is required to stably form a loop having high straightness.

Along with the high-density packaging, improvement in wire feeding performance is also required. When the wire is thinned along with high-density packaging, the wire may be locally thinned due to the tension applied in the wire axial direction during feeding of the wire. When the wire is locally thinned in the loop portion, the loop may be partially curved. Therefore, the bonding wire is required to suppress wire deformation during feeding of the wire.

In addition, as high-density packaging is advanced, the area of the electrode on the memory chip decreases, so that thinning of the bonding wire proceeds. A problem caused by thinning of the bonding wire is the stability of wire deformation amount in wedge bonding. When the wire becomes thinner, the bonding area of the wedge bond area decreases, making it difficult to obtain the bonding strength. When the variation in the wire deformation amount in the wedge bonding increases, in a case where the deformation amount suddenly decreases, the bonding strength is insufficient in the wedge bond area, causing separation of the wire from the electrode. Therefore, the bonding wire is required to reduce variation in the wire deformation amount in the wedge bonding in order to stably obtain good bonding strength.

As described above, in a wire used for the on-vehicle memory device, it is required to extend the high-temperature life, reduce chip damage during ball bonding, and improve characteristics such as ball bonding strength.

An object of the present invention is to provide an Ag alloy bonding wire for a semiconductor device capable of extending the high-temperature life of a wire, reducing chip damage during ball bonding, and improving characteristics such as ball bonding strength in applications of on-vehicle memory devices.

Solution to Problem

The Ag alloy bonding wire for a semiconductor device according to the present invention contains one or more of In and Ga for a total of 110 at ppm or more and less than 500 at ppm, and one or more of Pd and Pt for a total of 150 at ppm or more and less than 12,000 at ppm, and a balance being made up of Ag and unavoidable impurities.

Advantageous Effects of the Invention

According to the present invention, it is possible to extend the high-temperature life of a wire, reduce chip damage during ball bonding, and improve characteristics such as ball bonding strength in applications of on-vehicle memory devices.

DESCRIPTION OF EMBODIMENTS (Configuration of Bonding Wire)

According to the present invention, there is provided an Ag alloy bonding wire for a semiconductor device containing one or more of In and Ga for a total of 110 at ppm or more and less than 500 at ppm, and one or more of Pd and Pt for a total of 150 at ppm or more and less than 12,000 at ppm, and a balance being made up of Ag and unavoidable impurities. Hereinafter, the Ag alloy bonding wire for a semiconductor device is also simply referred to as a bonding wire.

(Effectiveness in High-Temperature Life)

The effectiveness of the bonding wire according to the present embodiment in high-temperature life will be described.

In order to improve the high-temperature life in the high temperature storage test at 220° C., it is effective to decrease the growth rate of the Ag—Al-based intermetallic compound. As a result of intensive studies, the inventors have found that when the bonding wire contains one or more of In and Ga for a total of 110 at ppm or more and less than 500 at ppm and one or more of Pd and Pt for a total of 150 at ppm or more and less than 12,000 at ppm, the ball is not separated from the electrode at the ball bond area even after the high temperature storage test at 220° C. for 600 hours or more, and a good bonding state can be maintained. As a result of observing the cross section of the ball bond area by using a scanning electron microscope for the sample after the high temperature storage test at 220° C. for 600 hours or more, the growth of the Ag—Al-based intermetallic compound containing $Ag_3Al$ was remarkably suppressed.

The growth rate of the Ag—Al-based intermetallic compound is controlled by diffusion of Ag and Al. Here, when In and Ga are defined as a first element group, and Pd and Pt are defined as a second element group, an alloy layer containing the first element group and the second element group has been formed at the Ag—Al bonding interface in the initial stage of the high temperature storage test. The concentrations of the first element group and the second element group contained in the alloy layer tended to be higher than the concentrations of those contained in the wire. The reason why in the bonding wire according to the present embodiment, the growth rate of the Ag—Al-based intermetallic compound is decreased in the high temperature storage test at 220° C. is considered to be that the alloy layer containing the first element group and the second element group effectively suppressed mutual diffusion of Ag and Al.

When the concentration of one or more of In and Ga contained in the bonding wire was less than 110 at ppm in total, or when the concentration of one or more of Pd and Pt contained in the bonding wire was less than 150 at ppm in total, the ball was separated from the electrode in the ball bond area in less than 600 hours in the high temperature test at 220° C. This is considered to be because the effect of decreasing the growth rate of the Ag—Al-based intermetallic compound was insufficient due to low total concentration of one or more of In and Ga or low total concentration of one or more of Pd and Pt.

When the concentration of one or more of In and Ga contained in the bonding wire was 500 at ppm or more in total, or the concentration of one or more of Pd and Pt contained in the bonding wire was 12,000 at ppm or more in total, the frequency of occurrence of chip damage increased, and as a result of which separation of the ball from the electrode occurred before the high temperature storage test. Thus, it was determined that practical use was difficult at the stage of ball bonding.

(Effectiveness in Reducing Chip Damage)

The effectiveness of the bonding wire according to the present embodiment in reducing chip damage will be described.

In order to reduce chip damage, it is effective to control the hardness and deformability of the ball within an appropriate range. As a result of intensive studies by the inventors, the inventors have found that chip damage can be reduced by containing one or more of In and Ga for a total of 110 at ppm or more and less than 500 at ppm and one or more of Pd and Pt for a total of 150 at ppm or more and less than 12,000 at ppm.

This is considered to be because, as a result of the synergistic action of In, Ga, Pd, and Pt, the effect of refining crystal grains constituting the ball and the effect of strengthening solid solution can be utilized, and thus the hardness and deformability of the ball can be controlled within an appropriate range.

When the concentration of one or more of In and Ga contained in the bonding wire was less than 110 at ppm in total, or when the concentration of one or more of Pd and Pt contained in the bonding wire was less than 150 at ppm in total, the ball bonding strength was insufficient. This is considered to be because the ball was too soft and the Al oxide on the surface of the Al alloy electrode was not sufficiently broken during ball bonding.

When the concentration of one or more of In and Ga contained in the bonding wire was 500 at ppm or more in total, or when the concentration of one or more of Pd and Pt contained in the bonding wire was 12,000 at ppm or more in total, the frequency of occurrence of chip damage increased. This is considered to be caused by the ball becoming too hard.

(Improvement of Characteristics of Bonding Wire)

From the above, the inventors found that it is effective to contain one or more of In and Ga for a total of 110 at ppm or more and less than 500 at ppm, and one or more of Pd and Pt for a total of 150 at ppm or more and less than 12,000 at ppm in order to simultaneously achieve extension of the high-temperature life, reduction in chip damage, and good ball bonding strength required for the on-vehicle memory device.

Further, the inventors found that a preferable concentration range of In and Ga is 400 at ppm or more and less than 500 at ppm in total, and a preferable concentration range of Pd and Pt is 7,000 at ppm or more and less than 12,000 at ppm in total. This is because the effect of extending the high-temperature life required for the on-vehicle memory device is particularly excellent. This is considered to be because the effect of suppressing the growth of the Ag—Al-based intermetallic compound containing $Ag_3Al$ is remarkably exhibited by setting concentrations of In and Ga to preferable ranges and setting concentrations of Pd and Pt to preferable ranges.

The bonding wire according to the present embodiment is found to be capable of simultaneously satisfying the performance and cost reduction required for the on-vehicle memory device, and providing a substitute for the Au wire.

(Concentration Analysis Method)

For concentration analysis of elements contained in the bonding wire, an inductively coupled plasma (ICP) emission spectroscopic analyzer or an ICP mass spectrometer can be used. When elements derived from contaminants, such as oxygen and carbon are adsorbed on the surface of the bonding wire, acid cleaning may be performed before analysis.

(Crystal Orientation of Wire Surface)

In the bonding wire according to the present embodiment, in a result of further measuring the crystal orientation of the wire surface of the bonding wire, the abundance ratio of the <100> crystal orientation having an angular difference of 15 degrees or less from the wire axial direction of the bonding wire is 60% or more and 100% or less, in terms of an area percentage, whereby loop straightness when a long span loop is formed can be improved.

(Loop Straightness)

In order to improve the loop straightness when the long span loop is formed, it is effective to control the crystal orientation of the loop portion with respect to the wire axial direction. As a result of intensive studies by the inventors, the inventors have found that, in a result of measuring the crystal orientation of the wire surface of the bonding wire, when the abundance ratio of the <100> crystal orientation having an angular difference of 15 degrees or less from the wire axial direction of the bonding wire is 60% or more and 100% or less, in terms of an area percentage, loop straightness when a long span loop is formed is improved. Here, the wire axis is an axis that passes through the center of the bonding wire and is parallel to the wire longitudinal direction.

The reason why the loop straightness when the long span loop was formed was improved is presumed to be that the effect of increasing the yield stress in the wire axial direction of the wire by containing one or more of In and Ga and one or more of Pd and Pt in the above concentration ranges and the effect of increasing the yield stress in the wire axial direction by increasing the orientation of the crystal orientation in the wire axial direction act synergistically.

(Method for Measuring Crystal Orientation)

A method for measuring the crystal orientation of the bonding wire surface in the present specification will be described. In the present specification, the crystal orientation of the wire surface is defined as the crystal orientation of Ag and an alloy portion mainly composed of Ag existing on the wire surface. For the measurement of the crystal orientation of the wire surface, an electron backscattered diffraction (EBSD) method can be used. An apparatus used for the EBSD method includes a scanning electron microscope and a detector provided in the scanning electron microscope. The EBSD method is a method for determining a crystal orientation of each measuring point by projecting a diffraction pattern of reflected electrons generated when a sample is irradiated with an electron beam on a detector surface and analyzing the diffraction pattern. Dedicated software (OIM analysis, manufactured by TSL solutions, etc.) can be used to analyze data obtained by the EBSD method. In the present embodiment, a bonding wire is fixed to a sample stage, and a wire surface is irradiated with an electron beam from one direction to acquire data of the crystal orientation. By using this method, the crystal orientation with respect to the wire axial direction among the crystal orientations of the wire surface can be determined.

In the present specification, an average area percentage is used as the value of the abundance ratio of a specific crystal orientation. Here, the abundance ratio is an area percentage of a region having a specific crystal orientation with respect to a measurement region. The average area percentage is an arithmetic average of respective values of the abundance ratios obtained by measuring in at least five or more measurement regions by the EBSD method. In selecting the measurement region, it is preferable to ensure the objectivity of the measurement data. As a method therefor, it is preferable to acquire a sample for measurement from the bonding wire to be measured at an interval of 3 m or more and less than 5 m with respect to the wire axial direction, and to use the sample for measurement. In each of the measurement regions, the length in the circumferential direction is preferably 25% or less of the diameter of the wire, and the length in the wire axial direction is preferably 40 µm or more and less than 100 µm on the image of the scanning electron microscope.

(Average Grain Size and Wire Feeding Performance)

In the bonding wire according to the present embodiment, when the average grain size in the cross section in the direction perpendicular to the wire axis is 0.1 µm or more and less than 3.1 µm, the wire feeding performance can be improved.

When the bonding wire is bonded, the wire is fed little by little from a state of being wound around a cylindrical jig called a spool. Since tensile stress is applied to the wire during feeding, the wire may be deformed, resulting in a reduced wire diameter. In order to prevent such a phenomenon, it is necessary to appropriately control mechanical characteristics with respect to the direction perpendicular to the wire axis.

As a result of intensive studies by the inventors, the inventors have found that when the average grain size in the cross section of the bonding wire in the direction perpendicular to the wire axis is 0.1 µm or more and less than 3.1 µm, high feeding performance can be obtained.

This is presumed to be because the effect of increasing the yield stress in the direction perpendicular to the wire axis by containing one or more of In and Ga for a total of 110 at ppm or more and less than 500 at ppm and one or more of Pd and Pt for a total of 150 at ppm or more and less than 12,000 at ppm and the effect of increasing the yield stress in the direction perpendicular to the wire axis by controlling the average grain size in the cross section in the direction perpendicular to the wire axis to an appropriate range act synergistically.

(Method for Exposing Wire Cross Section and Method for Determining Average Grain Size)

As a method for exposing the cross section of the wire, for example, mechanical polishing, an ion etching method, or the like can be used. As a method for determining the average grain size, the EBSD method can be used. In the EBSD method, a crystal misorientation between adjacent measuring points is obtained. Thus, the grain boundary can be determined. A grain boundary with a misorientation of 15 degrees or more was defined as a high angle grain boundary, and a region surrounded by the high angle grain boundary was defined as one crystal grain. The grain size was calculated as a diameter, assuming that the area calculated using dedicated analysis software belonged to a circle. In selecting the measurement region, it is preferable to ensure the objectivity of the measurement data. As a method therefor, it is preferable to acquire a sample for measurement from the bonding wire to be measured at an interval of 1 m or more and less than 3 m with respect to the wire axial direction, and to use the sample for measurement. The value of the grain size is an arithmetic average of values measured in three measurement regions. The measurement region is preferably a region including the entire cross section.

(Variation in Wire Deformation Amount in Wedge Bonding)

When the bonding wire according to the present embodiment further contains one or more of B, P, Ca, Cu, and Zr for a total of 15 at ppm or more and less than 450 at ppm, variation in the wire deformation amount in wedge bonding can be reduced.

In order to reduce the variation in the wire deformation amount in wedge bonding, it is effective to reduce variation in mechanical characteristics in the wire axial direction. As a result of intensive studies by the present inventors, the inventors have found that when the bonding wire further contains one or more of B, P, Ca, Cu, and Zr for a total of 15 at ppm or more and less than 450 at ppm, the variation in the wire deformation amount in wedge bonding can be reduced.

This is considered to be because the effect of increasing the yield stress in the wire axial direction by containing one or more of In and Ga for a total of 110 at ppm or more and less than 500 at ppm and one or more of Pd and Pt for a total of 150 at ppm or more and less than 12,000 at ppm and the effect of increasing the yield stress of the wire in the wire axial direction mainly through solid solution strengthening by containing one or more of B, P, Ca, Cu, and Zr for a total of 15 at ppm or more and less than 450 at ppm act synergistically. Since the influence inside the wire is presumed to be larger than the influence of the wire surface for the variation in the wire deformation amount in wedge bonding, addition of the above-described additive elements is effective.

As described above, by setting the total concentration of one or more of B, P, Ca, Cu, and Zr to 15 at ppm or more and less than 450 at ppm, there is an effect of increasing the yield stress in the wire axial direction, and the variation in the wire deformation amount in wedge bonding can be reduced. However, even when the bonding wire contains one or more of B, P, Ca, Cu, and Zr for a total concentration of 8 at ppm or more and less than 15 at ppm, it has been confirmed that there is no problem in practical use with the variation in the wire deformation amount in wedge bonding when the bonding wire contains one or more of In and Ga and one or more of Pd and Pt in the above concentration ranges.

EXAMPLES (Production of Bonding Wire)

A method for producing a bonding wire according to examples of the present invention will be described. As Ag as a raw material, Ag having a purity of 99.9 at. % or more with the balance being made up of unavoidable impurities was used. As In, Ga, Pd, Pt, B, P, Ca, Cu, and Zr, one having a purity of 99.9 at. % or more with the balance being made up of unavoidable impurities was used. The Ag alloy used for the bonding wire was produced by charging an Ag raw material and a raw material to be alloyed into a groove having a diameter of 3 mm or more and less than 6 mm processed in a carbon crucible and melting the raw materials using a high-frequency heating furnace. The atmosphere in the furnace during melting was an Ar gas atmosphere. The maximum temperature during melting was set to a range of 1,050° C. or more and less than 1,300° C. The cooling method after melting was furnace cooling. When the surface of the ingot after melting was sulfurized or an organic substance or the like was adsorbed, degreasing and acid cleaning were performed as necessary.

A cylindrical ingot having a diameter of 3 mm or more and less than 6 mm obtained by melting was subjected to a drawing process or the like using a die to manufacture a wire having a diameter of 20 μm. During the drawing process, a commercially available lubricant was used in order to ensure lubricity at the contact interface between the wire and the die. The area reduction ratio per die during the drawing process was 10.5% or more and less than 14.5%. Here, the area reduction ratio is a value obtained by expressing, in percentage, the ratio of the cross-sectional area of the wire reduced by the drawing process to the cross-sectional area of the wire before performing the drawing process. The wire feed speed during the drawing process was 20 m/min or more and less than 300 m/min. The wire after the drawing process was finally subjected to final heat treatment so that the breaking elongation was 9% or more and less than 15%. The final heat treatment was performed while continuously running the wire. The atmosphere during the final heat treatment was an Ar gas atmosphere. The heat treatment temperature in the final heat treatment was 370° C. or more and less than 650° C., and the heat treatment time was 0.1 seconds or more and less than 1.5 seconds.

(Control of Abundance Ratio of Crystal Orientation)

As a result of measuring the crystal orientations of the wire surface of the bonding wire, in order to control the abundance ratio of the <100> crystal orientation having an angular difference of 15 degrees or less from the wire axial direction of the bonding wire to be 60% or more and 100% or less, in terms of an area percentage, it was effective to control the area reduction ratio per one die to a range of 12.0% or more and less than 13.5%.

The reason why this method is effective will be described. By increasing the area reduction ratio per die, the <100> crystal orientation is easily developed on the wire surface. The <100> crystal orientation developed by the drawing process is mostly taken over after the final heat treatment is performed. Therefore, the crystal orientation of the wire surface after the final heat treatment can be controlled by controlling the crystal orientation during the drawing process. When the area reduction ratio per die was less than 12.0%, the abundance ratio of the <100> crystal orientation was less than 60%. When the area reduction ratio per die was 13.5% or more, the evaluation was stopped because the frequency of occurrence of disconnection of the wire during the drawing process increased.

(Control of Average Grain Size)

In order to control the average grain size in the cross section in the direction perpendicular to the wire axis to be 0.1 μm or more and less than 3.1 μm, for example, it is effective to perform a heat treatment (hereinafter, referred to as intermediate heat treatment) under heat treatment conditions necessary for removing the processing strain introduced into the material with a wire diameter (hereinafter, referred to as an intermediate wire diameter) before reaching a diameter of 20 μm in the drawing process.

(Intermediate Heat Treatment)

The purpose of the intermediate heat treatment is to temporarily remove a part of the strain introduced into the material by the drawing process. As a result, the amount of strain introduced into the material in a period from the intermediate wire diameter to a final wire diameter of 20 μm can be controlled within a certain range. The size of the recrystallized grain obtained by the final heat treatment depends mainly on the amount of strain introduced into the material before reaching the final wire diameter. Therefore, the grain size after the final heat treatment can be accurately controlled by controlling the wire diameter and heat treatment conditions for performing the intermediate heat treatment. An example of the intermediate heat treatment method for controlling the average grain size in the cross section in the direction perpendicular to the wire axis to a range of 0.1 μm or more and less than 3.1 μm and the conditions thereof will be described below.

As the intermediate heat treatment, a method of continuously running the wire can be used. It is effective to perform intermediate heat treatment using this method in a temperature range of 380° C. or more and less than 420° C. with a wire diameter of 150 μm or more and less than 220 μm. The heat treatment time during the intermediate heat treatment is effectively set to 0.1 seconds or more and less than 1.5 seconds. The atmosphere of the intermediate heat treatment is desirably an inert atmosphere such as an Ar gas atmosphere in order to prevent oxidization and sulfurization.

(Method for Evaluating Bonding Wire)

Next, an evaluation method and evaluation results of the bonding wire will be described. The wire diameter of the bonding wire used for evaluation was 20 μm. A lead frame made of a Cu alloy was used. A chip using Si was used for the semiconductor element. As the electrode on the semiconductor element, an electrode having a composition of Al-1% Si-0.5% Cu and a thickness of 1.5 μm was used. As the external electrode, the lead frame plated with Ag was used. A commercially available wire bonder (IConn, manufactured by Kulicke & Soffa Industries, Inc.) was used for bonding the bonding wire. The diameter of the ball used in this evaluation was in a range of 34 μm or more and less than 36 μm. In forming the ball, $N_2$+5% $H_2$ gas was allowed to flow at a flow rate of 0.4 L/min or more and less than 0.6 L/min.

(Method for Evaluating High-Temperature Life)

A method for evaluating the high-temperature life will be described. As ball bonding conditions, general Ag wire bonding conditions were used. 144 electrodes on the semiconductor element were ball-bonded under the above conditions, and then sealed with an epoxy-based resin so as to cover the entire ball bond area, wedge bond area, and loop portion. Subsequently, the sample manufactured by the above procedure was allowed to stand in a constant temperature furnace. The test conditions for the high temperature storage test were 220° C. and 600 hours or more. The atmosphere in the constant temperature furnace was an air atmosphere. The cross section of the sample after the high temperature storage test was polished to expose the ball bond area. Ten randomly selected ball bond areas were observed to examine whether the ball was separated from the electrode. In the above evaluation, a case where separation occurred at even one location after an elapse of 600 hours was judged to have a problem in practical use and rated as 0 points, and a case where no separation occurred at any location was judged to have no problem in practical use and rated as 1 point. Furthermore, a case where no separation occurred at any location after an elapse of 800 hours was judged to be excellent and rated as 2 points. The evaluation results are shown in the columns of "High-temperature life (220° C.)" in Tables 2-1, 2-2, and 2-3. Zero points indicate fail, 1 point and 2 points indicate pass.

(Method for Evaluating Chip Damage During Ball Bonding)

A method for evaluating chip damage during ball bonding will be described. Evaluation of chip damage during ball bonding was performed under conditions severer than conditions of normal ball bonding in order to perform accelerated evaluation of the occurrence of chip damage. Specifically, the thickness of the chip was set to 20 μm, the output of ultrasound was set to 1.5 times the general condition, and the load condition was set to 1.3 times the general condition. The presence of chip damage was confirmed by exposing the cross section of the ball bond area subjected to ball bonding, by mechanical polishing, and confirming occurrence of damage such as cracks in the chip. A scanning electron microscope was used to confirm the presence of chip damage. Five locations of chips were observed, and a case where even one chip was damaged was judged to have a problem in practical use and rated as 0 points. A case where no damage of chip was observed in any of the five locations was judged to have no problem in practical use and rated as 1 point. The evaluation results are shown in the columns of "Chip damage during ball bonding" in Tables 2-1, 2-2, and 2-3. Zero points indicate fail, and 1 point indicates pass.

(Method for Evaluating Bonding Strength of Ball Bond Area)

A method for evaluating the bonding strength of the ball bond area will be described. The bonding strength of the ball bond area was evaluated by performing ball bonding under general bonding conditions and using measured values for the shear strength of the ball bond area. For the measurement of the bonding strength, a commercially available micro shear strength tester was used. A case where the value of the bonding strength obtained by the shear strength test of the ball bond area was 12 gf or less was judged to be defective. As a result of measuring the shear strengths at 20 ball bond areas randomly selected, a case where there were three or more defects was judged to have a problem in practical use and rated as 0 points, and a case where there were two or less defects was judged to have no problem in practical use and rated as 1 point. The evaluation results are shown in the columns of "Bonding strength of ball bond area" in Tables 2-1, 2-2, and 2-3. Zero points indicate fail, and 1 point indicates pass.

(Method for Evaluating Loop Straightness when Long Span Loop is Formed)

A method for evaluating loop straightness when a long span loop is formed will be described. The loop formation conditions were set to a loop length of 15.0 mm and a loop height of 0.5 mm, which are more severe conditions than normal loop formation conditions, in consideration of the long span loop. The loop portions of bonded 144 bonding wires were observed with an optical microscope, and a case where there was a portion where the adjacent bonding wires were in contact with each other was judged to be defective. A case where there were three or more defects was judged to have a problem in practical use and rated as 0 points, a case where there were one or two defects was judged to have no problem in practical use and rated as 1 point, and a case where no defect occurred was judged to be particularly excellent and rated as 2 points. The evaluation results are shown in the columns of "Loop straightness when long span loop is formed" in Tables 2-1, 2-2, and 2-3. Zero points indicate fail, and other scores indicate pass.

(Method for Evaluating Wire Feeding Performance)

A method for evaluating wire feeding performance will be described. The wire feeding performance was evaluated by the ratio of the diameter of the wire after bonding to the diameter of the wire before bonding. The diameter of the wire before bonding is 20 μm. The diameter of the wire after bonding was determined using the result of observing the loop portion of the bonded wire with a scanning electron microscope. A case where the ratio was 95% or less was judged to have a problem in practical use and rated as 0 points, a case where the ratio was more than 95% and 97% or less was judged to have no problem in practical use and rated as 1 point, and a case where the ratio was more than 97% was judged to be particularly excellent and rated as 2 points. The evaluation results are shown in the columns of "Wire feeding performance" in Tables 2-1, 2-2, and 2-3. Zero points indicate fail, and other scores indicate pass.

(Method for Evaluating Wire Deformation Amount in Wedge Bonding)

A method of evaluating the wire deformation amount in wedge bonding will be described. The temperature of the stage during wedge bonding was 180° C. As conditions of ultrasound and load, conditions used for bonding of a general Ag wire were used. The deformation amount at randomly selected 10 locations was measured and evaluated by its standard deviation. The deformation amount was measured in a direction perpendicular to a direction parallel to the application direction of the ultrasound. In the above evaluation, a case where the standard deviation of the deformation amount in one or both of the parallel direction and the perpendicular direction was 1.2 μm or more was judged to have a problem in practical use and rated as 0 points, a case where the standard deviation of the deformation amount in both directions was 0.6 μm or more and less than 1.2 μm was judged to have no problem in practical use and rated as 1 point, and a case where the standard deviation of the deformation amount in both directions was less than 0.6 μm was judged to be particularly excellent and rated as 2 points. In addition, in a case where the deformation amount in the direction perpendicular to the application direction of ultrasound was less than 1.6 times the diameter of the wire among the wire deformation amounts in the wedge bonding, there is a high possibility that sufficient bonding strength of the wire bond area cannot be obtained. Thus, such a case was judged to have a problem in practical use and rated as 0 points. The evaluation results are shown in the columns of "Wire deformation amount in wedge bonding" in Tables 2-1, 2-2, and 2-3. Zero points indicate fail, and other scores indicate pass.

(Description of Evaluation Results)

Tables 1-1 and 1-2 collectively show the composition of the bonding wire according to the present example, the abundance ratio (%) of the <100> crystal orientation having an angular difference of 15 degrees or less from the wire axial direction on the wire surface, and the average grain size (μm) in the cross section in the direction perpendicular to the wire axis. Table 1-3 shows comparative examples. Tables 2-1 and 2-2 collectively show evaluation results corresponding to examples shown in Tables 1-1 and 1-2. Table 2-3 collectively shows evaluation results corresponding to comparative examples shown in Table 1-3.

The bonding wires of Examples Nos. 1 to 45 contain one or more of In and Ga for a total of 110 at ppm or more and less than 500 at ppm, and one or more of Pd and Pt for a total of 150 at ppm or more and less than 12,000 at ppm. It was confirmed that the bonding wires of Examples Nos. 1 to 45 were capable of simultaneously achieving extension of the high-temperature life, reduction in chip damage, and good ball bonding strength required for the on-vehicle memory device. In contrast, as shown in Comparative Examples Nos. 1 to 12, it was confirmed that when the concentrations of In and Ga and the concentrations of Pd and Pt were out of the above ranges, sufficient effects were not obtained.

It was confirmed that, in Examples Nos. 1 to 5, 7 to 10, 12, 13, 15 to 19, 21 to 30, 33 to 35, and 38 to 45, the abundance ratio of the <100> crystal orientation having an angular difference of 15 degrees or less from the wire axial direction of the bonding wire was 60% or more and 100% or less, in terms of an area percentage, and excellent loop straightness when a long span loop was formed was obtained. In Examples 6, 11, 14, 20, 31, 32, 36, and 37, the area percentage was less than 60%, and the loop straightness was in a practically acceptable range.

It was confirmed that, in Examples Nos. 1 to 23 and 26 to 45, the average grain size in the cross section of the bonding wire in the direction perpendicular to the wire axis was 0.1 μm or more and less than 3.1 μm, and excellent wire feeding performance was obtained. In Examples 24 and 25, the average grain size was less than 0.1 μm or 3.1 μm or more, and the wire feeding performance was in a practically acceptable range.

In Examples Nos. 26 to 30 and 36 to 45, one or more of B, P, Ca, Cu, and Zr are contained for a total of 15 at ppm or more and less than 450 at ppm, and the variation in the wire deformation amount during wedge bonding was small, which was particularly excellent. The total content of one or more of B, P, Ca, Cu, and Zr in Examples 1 to 25 and 31 to 35 was less than 15 at ppm, and the variation in the wire deformation amount during wedge bonding was in a practically acceptable range.

TABLE 1-1

| | | Elements contained and concentration | | | | | | | | |
|---|---|---|---|---|---|---|---|---|---|---|
| | Sample No. | In concentration (at ppm) | Ga concentration (at ppm) | In + Ga concentration (at ppm) | Pd concentration (at ppm) | Pt concentration (at ppm) | Pd + Pt concentration (at ppm) | B concentration (at ppm) | P concentration (at ppm) | Ca concentration (at ppm) |
| Example | 1 | — | 110 | 110 | 150 | — | 150 | — | — | — |
| | 2 | — | 110 | 110 | — | 150 | 150 | — | — | — |
| | 3 | 110 | — | 110 | 150 | — | 150 | — | — | — |
| | 4 | 110 | — | 110 | — | 150 | 150 | — | — | — |
| | 5 | — | 490 | 490 | 11900 | — | 11900 | — | — | — |
| | 6 | — | 491 | 491 | — | 11900 | 11900 | — | — | — |
| | 7 | 497 | — | 497 | 11900 | — | 11900 | — | — | — |
| | 8 | 498 | — | 498 | — | 11900 | 11900 | — | — | — |
| | 9 | 60 | 50 | 110 | 155 | — | 155 | — | — | — |
| | 10 | 55 | 55 | 110 | — | 158 | 158 | — | — | — |
| | 11 | — | 114 | 114 | 55 | 95 | 150 | — | — | — |
| | 12 | 114 | — | 114 | 60 | 90 | 150 | — | — | — |

TABLE 1-1-continued

| Sample No. | | | | | | | | | |
|---|---|---|---|---|---|---|---|---|---|
| 13 | 40 | 70 | 110 | 65 | 85 | 150 | — | — | — |
| 14 | — | 446 | 446 | 2000 | — | 2000 | — | — | — |
| 15 | — | 452 | 452 | — | 6800 | 6800 | — | — | — |
| 16 | 478 | — | 478 | 2000 | — | 2000 | — | — | — |
| 17 | 496 | — | 496 | — | 6900 | 6900 | — | — | — |
| 18 | 450 | — | 450 | 2500 | — | 2500 | — | — | — |
| 19 | 432 | — | 432 | 9800 | — | 9800 | — | — | — |
| 20 | — | 430 | 430 | — | 7000 | 7000 | — | — | — |
| 21 | — | 429 | 429 | — | 7000 | 7000 | — | — | — |
| 22 | 422 | — | 422 | 7100 | — | 7100 | — | — | — |
| 23 | 390 | — | 390 | 6900 | — | 6900 | — | — | — |
| 24 | — | 390 | 390 | — | 6900 | 6900 | — | — | — |
| 25 | — | 395 | 395 | — | 6900 | 6900 | — | — | — |

| | Sample No. | Elements contained and concentration | | | Abundance ratio of <100> crystal orientation having angular difference of 15 degrees or less from wire axial direction on wire surface (%) | Average grain size in cross section in direction perpendicular to wire axis (μm) |
|---|---|---|---|---|---|---|
| | | Cu concentration (at ppm) | Zr concentration (at ppm) | B + P + Ca + Cu + Zr concentration (at ppm) | | |
| Example | 1 | — | — | 0 | 65 | 0.7 |
| | 2 | — | — | 0 | 85 | 0.8 |
| | 3 | — | — | 0 | 71 | 1.1 |
| | 4 | — | — | 0 | 72 | 1.6 |
| | 5 | — | — | 0 | 67 | 0.2 |
| | 6 | — | — | 0 | 55 | 0.2 |
| | 7 | — | — | 0 | 79 | 0.7 |
| | 8 | — | — | 0 | 78 | 0.6 |
| | 9 | — | — | 0 | 85 | 1.3 |
| | 10 | — | — | 0 | 78 | 2.5 |
| | 11 | — | — | 0 | 55 | 2.2 |
| | 12 | — | — | 0 | 64 | 2.1 |
| | 13 | — | — | 0 | 88 | 2.3 |
| | 14 | — | — | 0 | 54 | 0.9 |
| | 15 | — | — | 0 | 70 | 0.8 |
| | 16 | — | — | 0 | 83 | 0.9 |
| | 17 | — | — | 0 | 86 | 0.7 |
| | 18 | — | — | 0 | 60 | 0.8 |
| | 19 | — | — | 0 | 100 | 0.7 |
| | 20 | — | — | 0 | 59 | 0.5 |
| | 21 | — | — | 0 | 94 | 0.5 |
| | 22 | — | — | 0 | 76 | 0.1 |
| | 23 | — | — | 0 | 74 | 3.0 |
| | 24 | — | — | 0 | 63 | 0.05 |
| | 25 | — | — | 0 | 68 | 3.1 |

TABLE 1-2

| | Sample No. | Elements contained and concentration | | | | | | | |
|---|---|---|---|---|---|---|---|---|---|
| | | In concentration (at ppm) | Ga concentration (at ppm) | In + Ga concentration (at ppm) | Pd concentration (at ppm) | Pt concentration (at ppm) | Pd + Pt concentration (at ppm) | B concentration (at ppm) | P concentration (at ppm) | Ca concentration (at ppm) |
| Example | 26 | — | 480 | 480 | — | 11000 | 11000 | 15 | — | — |
| | 27 | 497 | — | 497 | 8400 | — | 8400 | — | 16 | — |
| | 28 | 496 | — | 496 | 8300 | — | 8300 | — | — | 15 |
| | 29 | 487 | — | 487 | 6700 | — | 6700 | — | — | — |
| | 30 | — | 498 | 498 | — | 8800 | 8800 | — | — | — |
| | 31 | — | 360 | 360 | 5500 | — | 5500 | 8 | — | — |
| | 32 | 489 | — | 489 | — | 7800 | 7800 | — | 10 | — |
| | 33 | 470 | — | 470 | — | 10000 | 10000 | — | — | 12 |
| | 34 | 480 | — | 480 | — | 9500 | 9500 | — | — | — |
| | 35 | — | 390 | 390 | 6700 | — | 6700 | — | — | — |
| | 36 | 450 | — | 450 | — | 9800 | 9800 | — | 10 | 5 |
| | 37 | 480 | — | 480 | — | 8900 | 8900 | — | 5 | — |
| | 38 | — | 410 | 410 | — | 800 | 800 | — | — | 3 |
| | 39 | — | 370 | 370 | — | 6000 | 6000 | 447 | — | — |
| | 40 | — | 420 | 420 | 5500 | — | 5500 | — | 448 | — |
| | 41 | 460 | — | 460 | 9000 | — | 9000 | — | — | 448 |
| | 42 | 490 | — | 490 | — | 9500 | 9500 | — | — | — |

TABLE 1-2-continued

| | | | | | | | | | |
|---|---|---|---|---|---|---|---|---|---|
| 43 | 460 | — | 460 | — | 7700 | 7700 | — | — | — |
| 44 | 480 | — | 480 | — | 11000 | 11000 | — | 70 | — |
| 45 | 470 | — | 470 | — | 10000 | 10000 | — | — | — |

| | Sample No. | Elements contained and concentration | | | Abundance ratio of <100> crystal orientation having angular differemce of 15 degrees or less from wire axial direction on wire surface (%) | Average grain size in cross section in direction perpendicular to wire axis (μm) |
|---|---|---|---|---|---|---|
| | | Cu concentration (at ppm) | Zr concentration (at ppm) | B + P + Ca + Cu + Zr concentration (at ppm) | | |
| Example | 26 | — | — | 15 | 71 | 0.7 |
| | 27 | — | — | 16 | 79 | 1.0 |
| | 28 | — | — | 15 | 79 | 0.9 |
| | 29 | 17 | — | 17 | 78 | 0.9 |
| | 30 | — | 15 | 15 | 65 | 1.2 |
| | 31 | — | — | 8 | 32 | 0.8 |
| | 32 | — | — | 10 | 39 | 0.7 |
| | 33 | — | — | 12 | 89 | 0.6 |
| | 34 | 14 | — | 14 | 88 | 0.5 |
| | 35 | — | 14 | 14 | 95 | 0.8 |
| | 36 | — | — | 15 | 31 | 0.9 |
| | 37 | 10 | — | 15 | 29 | 0.9 |
| | 38 | 12 | — | 15 | 78 | 1.5 |
| | 39 | — | — | 447 | 68 | 0.8 |
| | 40 | — | — | 448 | 65 | 0.9 |
| | 41 | — | — | 448 | 79 | 0.8 |
| | 42 | 448 | — | 448 | 74 | 0.8 |
| | 43 | — | 447 | 447 | 77 | 0.7 |
| | 44 | — | — | 70 | 73 | 0.6 |
| | 45 | 70 | — | 70 | 88 | 0.7 |

TABLE 1-3

| | Sample No. | Elements contained and concentration | | | | | | | |
|---|---|---|---|---|---|---|---|---|---|
| | | In concentration (at ppm) | Ga concentration (at ppm) | In + Ga concentration (at ppm) | Pd concentration (at ppm) | Pt concentration (at ppm) | Pd + Pt concentration (at ppm) | B concentration (at ppm) | P concentration (at ppm) | Ca concentration (at ppm) |
| Comparative Example | 1 | — | 480 | 480 | — | — | 0 | — | — | — |
| | 2 | 490 | — | 490 | — | — | 0 | — | — | — |
| | 3 | — | — | 0 | 11000 | — | 11000 | — | — | — |
| | 4 | — | — | 0 | — | 11500 | 11500 | — | — | — |
| | 5 | — | 105 | 105 | 11800 | — | 11800 | — | — | — |
| | 6 | 108 | — | 108 | — | 11900 | 11900 | — | — | — |
| | 7 | — | 355 | 355 | 145 | — | 145 | — | — | — |
| | 8 | 332 | — | 332 | — | 148 | 148 | — | — | — |
| | 9 | — | 512 | 512 | 11700 | — | 11700 | — | — | — |
| | 10 | 504 | — | 504 | — | 11600 | 11600 | — | — | — |
| | 11 | — | 350 | 350 | 12500 | — | 12500 | — | — | — |
| | 12 | 364 | — | 364 | — | 12600 | 12600 | — | — | — |

| | Sample No. | Elements contained and concentration | | | Abundance ratio of <100> crystal orientation having angular differemce of 15 degrees or less from wire axial direction on wire surface (%) | Average grain size in cross section in direction perpendicular to wire axis (μm) |
|---|---|---|---|---|---|---|
| | | Cu concentration (at ppm) | Zr concentration (at ppm) | B + P + Ca + Cu + Zr concentration (at ppm) | | |
| Comparative Example | 1 | — | — | 0 | 65 | 2.6 |
| | 2 | — | — | 0 | 70 | 2.3 |
| | 3 | — | — | 0 | 66 | 0.7 |
| | 4 | — | — | 0 | 71 | 0.6 |
| | 5 | — | — | 0 | 55 | 0.6 |
| | 6 | — | — | 0 | 58 | 0.7 |
| | 7 | — | — | 0 | 67 | 2.8 |

TABLE 1-3-continued

| | | | | | |
|---|---|---|---|---|---|
| 8 | — | — | 0 | 34 | 2.7 |
| 9 | — | — | 0 | 38 | 1.9 |
| 10 | — | — | 0 | 70 | 1.9 |
| 11 | — | — | 0 | 69 | 2.0 |
| 12 | — | — | 0 | 67 | 1.9 |

TABLE 2-1

| | Sample No. | High-temperature life (220° C.) | Chip damage during ball bonding | Bonding strength of ball bond area | Loop straightness when long span loop is formed | Wire feeding performance | Wire deformation amount in wedge bonding |
|---|---|---|---|---|---|---|---|
| Example | 1 | 1 | 1 | 1 | 2 | 2 | 1 |
| | 2 | 1 | 1 | 1 | 2 | 2 | 1 |
| | 3 | 1 | 1 | 1 | 2 | 2 | 1 |
| | 4 | 1 | 1 | 1 | 2 | 2 | 1 |
| | 5 | 2 | 1 | 1 | 2 | 2 | 1 |
| | 6 | 2 | 1 | 1 | 1 | 2 | 1 |
| | 7 | 2 | 1 | 1 | 2 | 2 | 1 |
| | 8 | 2 | 1 | 1 | 2 | 2 | 1 |
| | 9 | 1 | 1 | 1 | 2 | 2 | 1 |
| | 10 | 1 | 1 | 1 | 2 | 2 | 1 |
| | 11 | 1 | 1 | 1 | 1 | 2 | 1 |
| | 12 | 1 | 1 | 1 | 2 | 2 | 1 |
| | 13 | 1 | 1 | 1 | 2 | 2 | 1 |
| | 14 | 1 | 1 | 1 | 1 | 2 | 1 |
| | 15 | 1 | 1 | 1 | 2 | 2 | 1 |
| | 16 | 1 | 1 | 1 | 2 | 2 | 1 |
| | 17 | 1 | 1 | 1 | 2 | 2 | 1 |
| | 18 | 1 | 1 | 1 | 2 | 2 | 1 |
| | 19 | 2 | 1 | 1 | 2 | 2 | 1 |
| | 20 | 2 | 1 | 1 | 1 | 2 | 1 |
| | 21 | 2 | 1 | 1 | 2 | 2 | 1 |
| | 22 | 2 | 1 | 1 | 2 | 2 | 1 |
| | 23 | 1 | 1 | 1 | 2 | 2 | 1 |
| | 24 | 1 | 1 | 1 | 2 | 1 | 1 |
| | 25 | 1 | 1 | 1 | 2 | 1 | 1 |

TABLE 2-2

| | Sample No. | High-temperature life (220° C.) | Chip damage during ball bonding | Bonding strength of ball bond area | Loop straightness when long span loop is formed | Wire feeding performance | Wire deformation amount in wedge bonding |
|---|---|---|---|---|---|---|---|
| Example | 26 | 2 | 1 | 1 | 2 | 2 | 2 |
| | 27 | 2 | 1 | 1 | 2 | 2 | 2 |
| | 28 | 2 | 1 | 1 | 2 | 2 | 2 |
| | 29 | 1 | 1 | 1 | 2 | 2 | 2 |
| | 30 | 2 | 1 | 1 | 2 | 2 | 2 |
| | 31 | 1 | 1 | 1 | 1 | 2 | 1 |
| | 32 | 2 | 1 | 1 | 1 | 2 | 1 |
| | 33 | 2 | 1 | 1 | 2 | 2 | 1 |
| | 34 | 2 | 1 | 1 | 2 | 2 | 1 |
| | 35 | 1 | 1 | 1 | 2 | 2 | 1 |
| | 36 | 2 | 1 | 1 | 1 | 2 | 2 |
| | 37 | 2 | 1 | 1 | 1 | 2 | 2 |
| | 38 | 1 | 1 | 1 | 2 | 2 | 2 |
| | 39 | 1 | 1 | 1 | 2 | 2 | 2 |
| | 40 | 1 | 1 | 1 | 2 | 2 | 2 |
| | 41 | 2 | 1 | 1 | 2 | 2 | 2 |
| | 42 | 2 | 1 | 1 | 2 | 2 | 2 |
| | 43 | 2 | 1 | 1 | 2 | 2 | 2 |
| | 44 | 2 | 1 | 1 | 2 | 2 | 2 |
| | 45 | 2 | 1 | 1 | 2 | 2 | 2 |

TABLE 2-3

|  | Sample No. | High-temperature life (220° C.) | Chip damage during ball bonding | Bonding strength of ball bond area | Loop straightness when long span loop is formed | Wire feeding performance | Wire deformation amount in wedge bonding |
|---|---|---|---|---|---|---|---|
| Comparative Example | 1 | 0 | 1 | 0 | 0 | 1 | 0 |
|  | 2 | 0 | 1 | 0 | 0 | 1 | 0 |
|  | 3 | 0 | 1 | 0 | 0 | 1 | 0 |
|  | 4 | 0 | 1 | 0 | 0 | 1 | 0 |
|  | 5 | 0 | 1 | 0 | 0 | 1 | 0 |
|  | 6 | 0 | 1 | 0 | 0 | 1 | 0 |
|  | 7 | 0 | 1 | 0 | 0 | 1 | 0 |
|  | 8 | 0 | 1 | 0 | 0 | 1 | 0 |
|  | 9 | 0 | 0 | 0 | 0 | 1 | 1 |
|  | 10 | 0 | 0 | 0 | 1 | 1 | 1 |
|  | 11 | 0 | 0 | 0 | 1 | 1 | 1 |
|  | 12 | 0 | 0 | 0 | 1 | 1 | 1 |

The invention claimed is:

1. An Ag alloy bonding wire for a semiconductor device containing one or more of In and Ga for a total of 110 at. ppm or more and less than 500 at. ppm, and one or more of Pd and Pt for a total of 150 at. ppm or more and less than 12,000 at. ppm, and a balance being made up of Ag and unavoidable impurities.

2. The Ag alloy bonding wire for a semiconductor device according to claim 1, wherein as a result of measuring crystal orientations of a wire surface of the bonding wire, an abundance ratio of a<100>crystal orientation having an angular difference of 15 degrees or less from a wire axial direction of the bonding wire is 60% or more and 100% or less, in terms of an area percentage.

3. The Ag alloy bonding wire for a semiconductor device according to claim 2, wherein an average grain size in a cross section of the bonding wire in a direction perpendicular to a wire axis is 0.1 μm or more and less than 3.1 μm.

4. The Ag alloy bonding wire for a semiconductor device according to claim 3, further containing one or more of B, P, Ca, Cu, and Zr for a total of 15 at. ppm or more and less than 450 at. ppm.

5. The Ag alloy bonding wire for a semiconductor device according to claim 2, further containing one or more of B, P, Ca, Cu, and Zr for a total of 15 at. ppm or more and less than 450 at. ppm.

6. The Ag alloy bonding wire for a semiconductor device according to claim 1, wherein an average grain size in a cross section of the bonding wire in a direction perpendicular to a wire axis is 0.1 μm or more and less than 3.1 μm.

7. The Ag alloy bonding wire for a semiconductor device according to claim 6, further containing one or more of B, P, Ca, Cu, and Zr for a total of 15 at. ppm or more and less than 450 at. ppm.

8. The Ag alloy bonding wire for a semiconductor device according to claim 1, further containing one or more of B, P, Ca, Cu, and Zr for a total of 15 at. ppm or more and less than 450 at. ppm.

* * * * *